United States Patent
Pedersen

Patent Number: 5,898,318
Date of Patent: Apr. 27, 1999

[54] PROGRAMMABLE LOGIC ARRAY INTEGRATED CIRCUITS WITH ENHANCED CASCADE

[75] Inventor: Bruce B. Pedersen, San Jose, Calif.

[73] Assignee: Altera Corporation, San Jose, Calif.

[21] Appl. No.: 08/497,100

[22] Filed: Jun. 30, 1995

Related U.S. Application Data

[63] Continuation-in-part of application No. 08/334,879, Nov. 4, 1994, abandoned.

[51] Int. Cl.$^6$ .......................... H03K 7/38; H03K 19/177
[52] U.S. Cl. ................................................. 326/39; 326/41
[58] Field of Search ................................... 326/39, 40, 41

[56] References Cited

U.S. PATENT DOCUMENTS

| | | | |
|---|---|---|---|
| 4,642,487 | 2/1987 | Carter | 326/41 |
| 5,109,353 | 4/1992 | Sample et al. | 364/578 |
| 5,121,006 | 6/1992 | Pedersen | 326/39 |
| 5,220,214 | 6/1993 | Pedersen | 326/39 |
| 5,258,668 | 11/1993 | Cliff et al. | 326/39 |
| 5,260,611 | 11/1993 | Cliff et al. | 326/39 |
| 5,350,954 | 9/1994 | Patel | 326/39 |
| 5,357,153 | 10/1994 | Chiang et al. | 326/39 |
| 5,359,242 | 10/1994 | Veenstra | 326/39 |
| 5,450,608 | 9/1995 | Steele | 326/39 |
| 5,473,266 | 12/1995 | Ahanin et al. | 326/39 |

OTHER PUBLICATIONS

Flex 8000 Programmable Logic Device Family, Data Sheet, Altera Corporation pp. 29–42, Aug. 1993, ver.3.
Xilinx, Using the Dedicated Carry Logic in XC4000, XAPP 013.001, pp. 8–105—8–8–118. (No date available).
Patterson et al.; Computer Architecture, A Quantitative Approach; copyright 1990 by Morgan Kaufmann Publishers, Inc.; pp. 204–206.
Weste et al.; Principles of CMOS VLSI Design, A Systems Perspective; copyright 1985 by AT&T Bell Laboratories, Inc. and Kamran Eshraghian; pp. 180–183.

*Primary Examiner*—Edward P. Westin
*Assistant Examiner*—Richard Roseen
*Attorney, Agent, or Firm*—Townsend and Townsend and Crew

[57] ABSTRACT

A programmable logic device (10) has a number of programmable logic elements (LEs) (12) which are grouped together in a plurality of logic array blocks (LABs) (14). A global interconnect structure (20, 24) is provided for interconnecting a LAB with other LABs. Adjacent or nearby LEs are connectable to one another via cascade connectors (72) between LEs. The cascade is enhanced by providing a selector (90) that allows a cascade line from one LE to selectively be coupled to an input of an adjacent or nearby LE through a cascade logic gate (94).

26 Claims, 6 Drawing Sheets

PROGRAMMABLE LOGIC ARRAY INTEGRATED CIRCUITS WITH ENHANCED CASCADE

This patent application is a continuation-in-part of Ser. No. 08/334,879 filed Nov. 4, 1994 now abandoned.

BACKGROUND OF THE INVENTION

The present invention relates to the field of programmable logic and devices therefor. More specifically, in one embodiment the invention provides an improved programmable logic device with enhanced cascade function as well as associated methods of operation.

Programmable logic devices (PLDs) are well known to those in the electronics art. Such programmable logic devices are commonly referred to as PALs (Programmable Array Logic), PLAs (Programmable Logic Arrays), FPLAs (Field Programmable Logic Arrays), EPLDs (Electronically Programmable Logic Devices), EEPLDs, LCAs (Logic Cell Arrays), FPGAs (Field Programmable Gate Arrays), and the like. Such devices are used in a wide array of applications where it is desirable to configure or program an off the shelf device for a specific application. Such devices include, for example, the well known Classic™ EPLDs, MAX® 5000 EPLDs, and FLEX® EPLDs all made by Altera®.

These devices, while similar in some aspects of overall functionality, may be of very different types in terms of circuit architecture. One family of PLDs uses a sum-of-products (SOP) architecture whereby each output is the ORed sum of a number of ANDed product terms of the inputs. This family is represented by the Altera MAX® and Classic™ 5000 EPLDs. Another family of PLDs uses look-up tables (LUTs) to perform logic functions. This family is represented by the Altera FLEX® EPLDs.

Modern PLDs generally are constructed from small functional units variously referred to as logic modules or macrocells and herein referred to as logic elements (LEs). These LEs are typically identical or nearly identical throughout the PLD and perform a function that is a sub unit of the function of the entire PLD. For example, in a PLD based on a LUT architecture, the LEs might each be four input/one output LUTs. PLDs generally include an interconnect structure of conductors to provide a mechanism for selectably connecting the inputs and outputs of the LEs in order to perform the PLD functionality.

Larger PLD's of both the SOP and LUT type generally group the smaller LEs into larger functional units herein referred to as logic array blocks (LABs). The LABs can contain within them a local LAB interconnect that allows signals in one LE to be selectively connected to signals in a different LE in the same LAB. In such an architecture, a distinction is made between this LAB-interconnect (or local interconnect) and the interconnect structure between LABs that is referred to as the global interconnect (or general interconnect). The LAB-interconnect transmits signals from the global interconnect to the inputs of the individual LEs through a number of LAB-input lines. The LABs may be connected to one another and to input and output circuits by means of the global interconnect.

While such devices have met with substantial success, such devices also meet with certain limitations.

Some prior art programmable logic devices (PLD) enhanced their functionality by providing "cascade" circuitry whereby the output of a logic element could be logically ANDed with the output of an adjacent logic cell. Such an arrangement allowed, for example, the output of a single logic element to be not only a function of its four inputs but to be any function of its four inputs ANDed with any function of the four inputs of its adjacent LE. While this circuitry allowed some additional functionality, its usefulness was limited. Because the cascade circuitry allowed combining of outputs only, only functions of more than four variables that have a function of up to four variables ANDed with another function of up to four variables can be implemented.

From the above it is seen that an improved programmable logic device is desired.

SUMMARY OF THE INVENTION

The invention provides an improved programmable logic device in which cascade circuitry is provided whereby the output of a logic cell may be logically ANDed with the input of an adjacent logic cell. The new cascade feature provided by the invention allows for PLDs with four-input LEs to use individual LEs to implement many functions of five variables.

A computer system or other digital processing machine incorporating the invention will benefit from the enhanced LE of the PLD.

DESCRIPTION OF THE INVENTION

For the sake of clarity, the invention will be explained with reference to a PLD architecture that was disclosed in co-assigned U.S. Pat. No. 5,260,611 (the '611 patent), which is incorporated herein by reference. Some figures from that patent are reproduced here to aid in an understanding of the invention. However, it will be apparent to one skilled in the art that the invention may be used in a very wide variety of different PLD architectures including architectures that are fundamentally different from that disclosed in the '611 patent.

Figure 1:
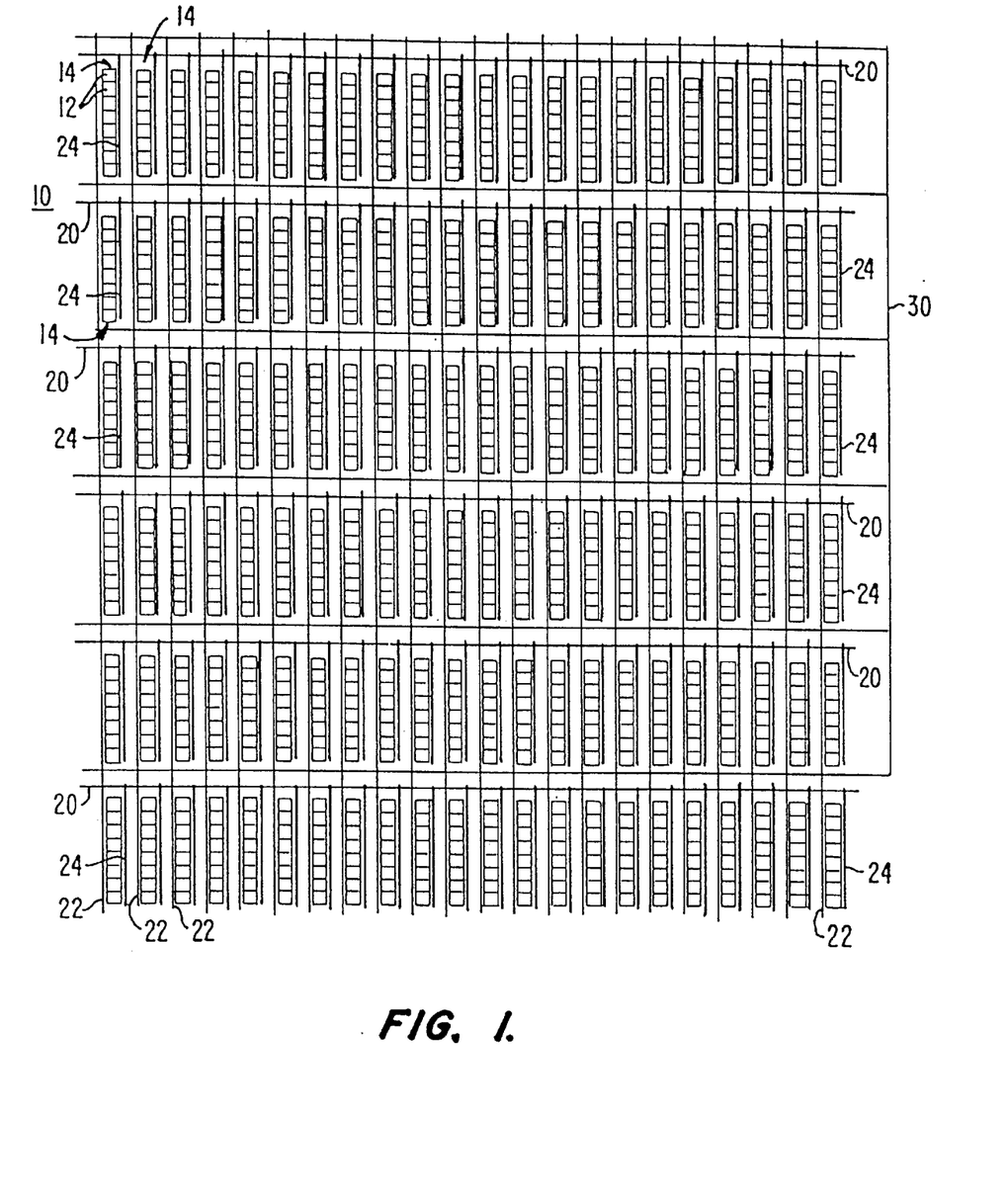
FIG. 1 is a simplified block diagram of a prior art PLD.

FIG. 1 shows the overall organization of an illustrative prior art PLD integrated circuit 10. Many details of this circuit not necessary for an understanding of the present invention are discussed in co-assigned U.S. Pat. No. 5,260,611. Not all of the conductors employed in circuit 10 are shown in FIG. 1, but enough is shown in this figure for the present discussion. Each LE 12 is represented by a small square in FIG. 1. LEs 12 are grouped together in groups of eight in this particular example. Each of these groups is referred to as a logic array block (LAB) 14. LABs 14 are arranged in six horizontal rows and twenty two vertical columns on circuit 10. Accordingly, there are a total of one hundred thirty two LABs 14 and one thousand fifty six LEs 12 on circuit 10. Each LE 12 is capable of performing a relatively elementary logic function, but extremely complex logic can be performed by variously interconnecting the LEs.

The interconnection circuitry shown in FIG. 1 includes groups of so-called global horizontal conductors (or global horizontal interconnect or general horizontal interconnect) 20 interspersed between the horizontal rows of LABs and groups of global vertical conductors (or global vertical interconnect) 22 interspersed between the vertical columns of LABS. These conductors are global in the sense that they extend along an entire row or column of LABs and are not localized to one LAB. Programmable interconnections can be made between select intersecting horizontal and vertical conductors in order to apply signals on the vertical conductors to the horizontal conductors. Although other numbers of conductors can be used if desired, in the depicted embodiment, there are one hundred seventy six conductors in each group of global horizontal conductors 20 and sixteen conductors in each group of global vertical conductors 22. In one specific embodiment, programmable connections are possible between a vertical conductor 22 and just one horizontal conductor 20 in each of the six horizontal rows that the vertical conductor crosses. This limitation is imposed on the general interconnect because the circuitry needed to selectively allow a connection between intersecting conductors takes up a certain amount of area on the chip and this chip area is limited.

The interconnection circuitry shown in FIG. 1 further includes groups of vertical LAB input conductors 24 associated with each LAB 14 for conveying signals from the global horizontal conductors 20 intersected by conductors 24 into the LEs 12 in that LAB. The conductors 24 are part of the LAB interconnect or local interconnect that is local to just one LAB. Signals from this LAB interconnect are selectably conveyed to LEs in the LAB through a number of LAB-input lines that are not shown in this figure. Finally, the interconnection circuitry shown in FIG. 1 includes a set of universal fast interconnect conductors 30 which are globally connected to all LABs and are designed to transmit fast signals throughout the PLD. Although other numbers of conductors can be used if desired, in the depicted embodiment there are twenty four conductors in each group of LAB input conductors 24 and there are four universal fast conductors 30.

Figure 2:
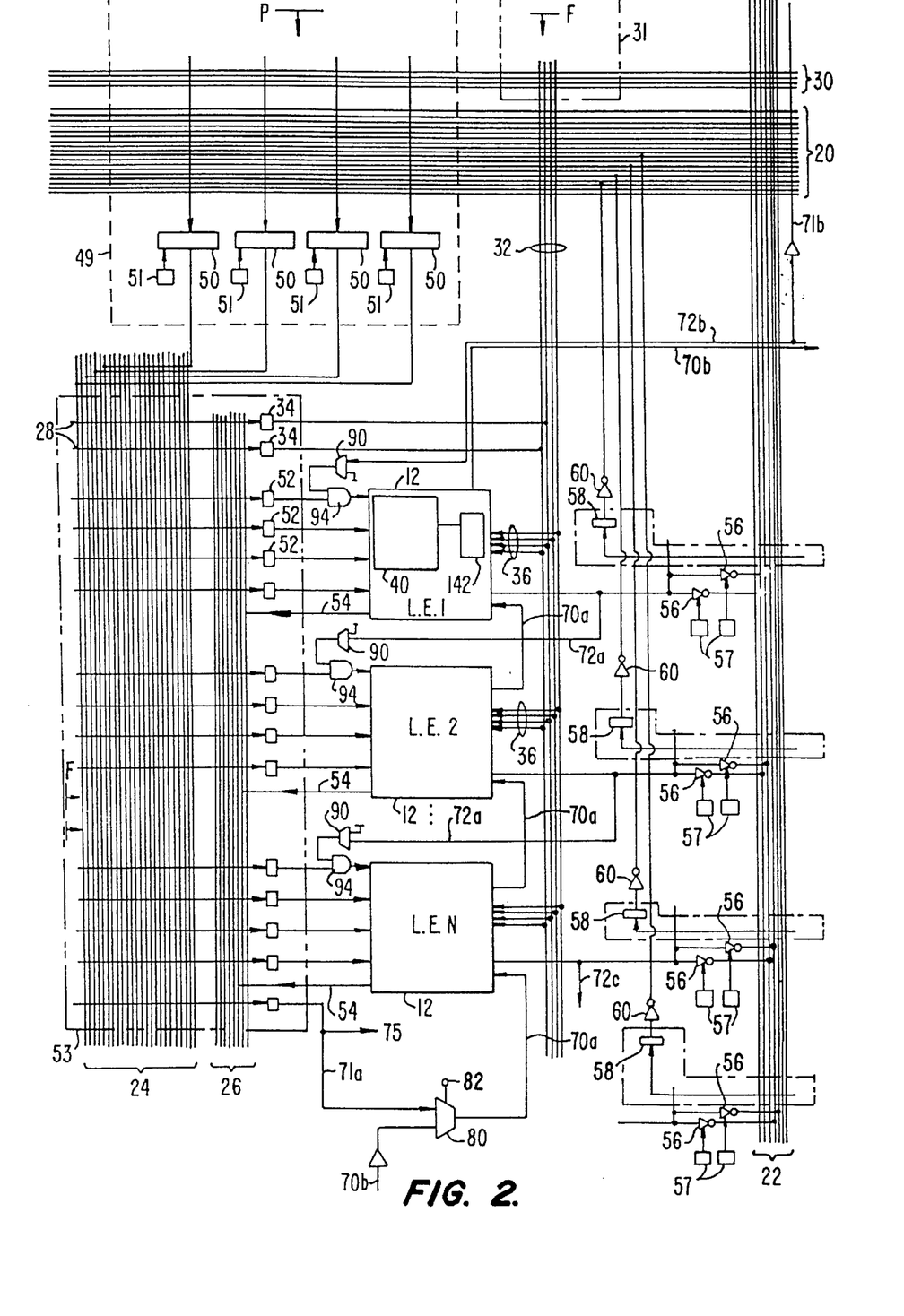
FIG. 2 is a simplified block diagram of a PLD showing an enhanced input cascade chain according to the invention.

Turning now to FIG. 2, which shows one possible implementation of part of a typical LAB 14 incorporating enhancements according to the invention, three representative LEs 12 are shown with labelling LE1, LE2, LEN indicating that any number of LEs could be included in various embodiments of a LAB. Although LEs 12 can be implemented in other ways (e.g., as product-term-based macrocells), in the illustrative embodiment shown in FIG. 2, each LE 12 includes a look up table or universal logic block ("ULB") 40 and a flip-flop type device 142.

In addition to the above-described representative LEs 12, FIG. 2 shows portions of representative global horizontal conductors 20, global vertical conductors 22, local LAB input conductors 24, local inter-LAB feed-back conductors 26, LAB-input lines 28, and universal fast conductors 30. Each of LAB input conductors 24 can be connected to a selected one (or more) of conductors 20 and 30 via a programmably controlled programmable logic connector ("PLC") 50 (only some of which are shown in FIG. 2). Local inter-LAB conductors 26 connect only to inter-LAB signals and are used primarily for feed-back of LE outputs through lines 54 to the inputs of other LEs in the same LAB.

PLCs 50 can be implemented in any of a wide variety of ways. For example, each PLC 50 can be a relatively simple programmable connector such as a plurality of switches for connecting any one of several inputs to an output. Examples of components suitable for implementing PLCs 50 are EPROMs, EEPROMs, pass transistors, transmission gates, antifuses, laser fuses, metal optional links, etc. The components of PLCs 50 can be controlled by various function control elements ("FCEs") as described in more detail below (although with certain PLC implementations (e.g., fuses and metal optional links) separate FCE devices are not required, so that in those cases the depiction of FCE devices in the accompanying drawings merely indicates that the PLCs are programmable). In the depicted embodiment each PLC 50 is a 15-to-1 multiplexer which is controlled by programmable function control elements ("FCEs") 51 to connect one of its fifteen inputs to its output. Each of the fifteen inputs is the signal on a predetermined respective one of conductors 20 or 30. There is one PLC 50 for each of the twenty four LAB input conductors 24. Each of conductors 20 and 30 is connected to two of PLCs 50. Accordingly, each of conductors 20 and 30 is connectable to two of conductors 24. The letter P and the associated arrow symbol inside dotted line 49 indicate that the population of connections from conductors 20 and 30 to the inputs of each of PLCs 50 is a partial population meaning that not every intersection indicates a possible interconnection.

Like PLCs 50, FCEs 51 can also be implemented in any of several different ways. For example, FCEs 51 can be SRAMs, DRAMs, first-in first-out ("FIFO") memories, EPROMs, EEPROMS, function control registers ferroelectric memories, fuses, antifuses, or the like.

Finally, FIG. 2 shows direct carry_in line 70a, direct carry_out line 70b, LAB-input carry-in line 71a, global interconnect carry_out line 71b, carry_in selector or PLC 80 with its associated FCE 82. The operation of these elements will be described further below.

Each of the four data inputs to each LE 12 can be connected to any one (or more) of LAB input conductors 24 and/or any one (or more) of local conductors 26 via a PLC 52. PLCs 52 (and similar PLCs 34 which are discussed below) may have any of the characteristics described above for the general case of PLCs 50. However, in the depicted, presently preferred embodiment each of PLCs 52 (and each similar PLC 34) is a 32-to-1 mux so that any one of the twenty-four LAB input conductors 24 or any one of the eight local conductors 26 can be connected to each LAB data input. Accordingly, the letter F and the associated arrow symbol inside chain dotted line 59 indicate that the population of connections from conductors 24 and 26 to PLCs 34 and 52 is a full population meaning that each intersection of lines indicates a possible interconnection. With these interconnections just described, any of the signals on the global horizontal lines 20 in that row or on universal fast interconnects 30 may be connected to any of the LE inputs. To avoid overcrowding the drawing, the FCEs (similar to above-described FCEs 51) for programmably controlling PLCs 34 and 52 are not shown separately, but rather are assumed to be part of elements 34 and 52.

The data output of each LE 12 can be applied (via conductor 54) to a respective one of local conductors 26. These conductors serve only the LEs in the associated LAB 14. In other words, conductors 26 do not extend beyond the associated LAB. The data output of LE 12 can also be applied to either or both of two global vertical conductors 22 (via tri-state drivers 56), and to one of global horizontal conductors 20 (via PLC 58 and tri-state driver 60). The other input or inputs to each PLC 58 are the signals from one or more of global vertical conductors 22. Accordingly, global vertical conductors 22 are selectively connectable to global horizontal conductors 20 via PLCs 58 and tri-state drivers 60. PLCs 58 may be similar to any of the above-described PLCs. The use of tri-state drivers 56 and 60 is advantageous to strengthen signals which may be required to travel relatively long distances throughout circuit 10 and/or which may be inputs to relatively large numbers of other components. Some or all of tri-state drivers 56 and 60 may be controlled (i.e., turned on or off) by FCEs (e.g., FCEs 57) on circuit 10. PLCs 58 are also typically controlled by FCES on the circuit. All of these FCEs may be similar to above-described FCEs 51.

In addition to being available as data inputs to LEs 12, the signals on any of conductors 24 and 26 can also or alternatively be applied to any of local vertical conductors 32 via PLCs 34. In the depicted embodiment, each of PLCs 34 is a 32-to-1 switch, but PLCs 34 can alternatively have any of the characteristics described above for the general case of PLCs 50. Although only two PLCs 34 are shown in FIG. 2, there is preferably one such PLC for each of the four conductors 32. Each of conductors 32 is connectable to any one of universal fast conductors 30 for receiving the signal on the fast conductor. These connections from conductors 30 to conductors 32 are preferably made in the same way that the connections from conductors 24 and 26 to conductors 32 are made, i.e., by PLCs controlled by FCEs (all represented by element 31 in FIG. 2). Again, although each of these PLCs can have any of the characteristics described above for the general case of PLCs 50, in the depicted, presently preferred embodiment each of these PLCs can connect any of conductors 30 to an associated one of conductors 32. The letter F and the arrow symbol inside chain dotted line 31 indicate that the population of possible connections from conductors 30 to each of conductors 32 is a full population. Each of conductors 32 is connectable (via conductors 36) to each of LEs 12. FCE-controlled PLCs in each LE allow these signals to be used for such purposes as flip-flop clock and flip-flop clear. Thus local vertical conductors 32 are known as clock and clear lines and can be driven from fast lines 30 for synchronous clocks and clears (i.e., clocks and clears which come from outside of device 10 and are available everywhere throughout device 10), or from LAB input lines 24 or local lines 26.

According to the invention, a LAB in PLD 10 is provided with cascade connect conductors associated logic gates 94 and selectors or PLCs 90. These elements operate together to give the additional functionality of the invention described in more detail in the discussion of FIG. 3. They allow the data output of a LE to be logically combined with the input of an adjacent or nearby LE 12, if desired, to perform more complex logic functions without the need to pass intermediate data through the general interconnection network. The elements are an enhancement over the cascade conductors disclosed in commonly assigned, co-pending application Ser. No. 07/880,888 incorporated herein by reference for all purposes.

FIG. 2 further illustrates an enhanced carry chain discussed in related co-assigned and co-pending patent application Ser. No. 08/497,213 according to the invention. The direct carry chain is represented in part by conductors 70a and 70b. These interconnections allow a carry_out output of each LE 12 to be used as a carry_in input to an adjacent or nearby LE as shown, for example, in commonly assigned, co-pending patent application Ser. No. 07/880,752 incorporated herein by reference for all purposes. For example, carry chain conductors 70a allow the carry_out output of each LE 12 shown in FIG. 2 to be the carry_in input to the next higher LE in that Fig. Similarly, carry chain conductor 70b runs from the top-most LE 12 in the LAB fragment shown in FIG. 2 to the bottom-most LE in the horizontally adjacent LAB in the adjacent column of LABs. This allows the carry chain to continue from LAB to LAB if desired.

Figure 3:
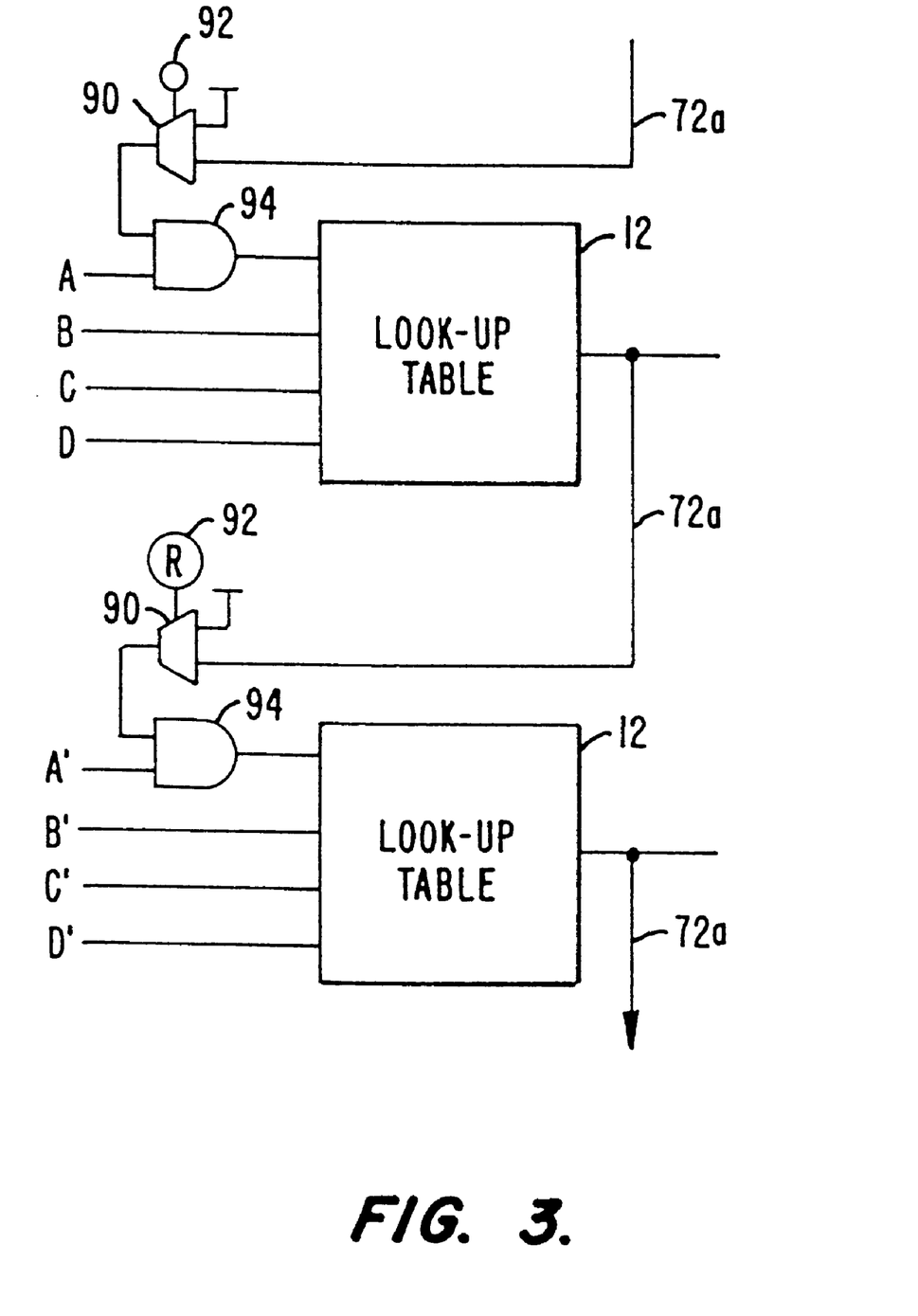
FIG. 3 is an alternative simplified block diagram showing two LEs with an enhanced cascade and omitting many of the details of FIG. 2.

FIG. 3 illustrates two LE's 12 according to the invention. While the discussion so far has suggested use of these LEs in a LAB, the invention may be employed in PLD devices that do not group LEs into LABs. A cascade chain is represented by a cascade connector 72a. According to the invention, the cascade chain allows the output of a LE to be logically combined with one of the input lines to the LE before that input signal is input to the LE. In a specific embodiment, this is accomplished through use of cascade selector 90. Cascade selector 90 is controlled by a FCE 92 such that one of the signals to logic gate 94 may be either the output of an adjacent LE or may be a constant (designed to not effect the output of logic gate 90). In a specific embodiment, logic gate 94 performs AND function and one of the inputs of selector 90 is permanently connected to a true logic level.

In an embodiment where the LEs are grouped in LABs, each LAB may be provided with a cascade-out connector 72c (shown in FIG. 2) to enable the output of the last LE in that LAB to be cascaded to a LE in an adjacent or nearby LAB through a cascade-in connector 72b (shown in FIG. 2). In a further embodiment, cascade-out connector 72c may be connectable to the general interconnect and cascade-in 72b may be connectable to the general interconnect or to the LAB interconnect.

As discussed above, prior art PLDs with output cascade circuitry allowed, for example, the output of a single LE to be not only a function of its four inputs but to be any function of its four inputs ANDed with any function of the four inputs of its adjacent LE.

As illustrated in FIG. 3, the present invention provides a means further enhancing a PLD by ANDing one of the inputs to a LE with the output of an adjacent LE. Since the adjacent LE now feeds one of the inputs to the look-up table, more complex functions are possible than just a simple "AND." The invention can thus be used to implement many functions of five variables. By tying input "A" in FIG. 3 to VCC, the invention can also implement all four input functions where one of the inputs is a "fast" cascade input from the adjacent LE.

Figure 4:
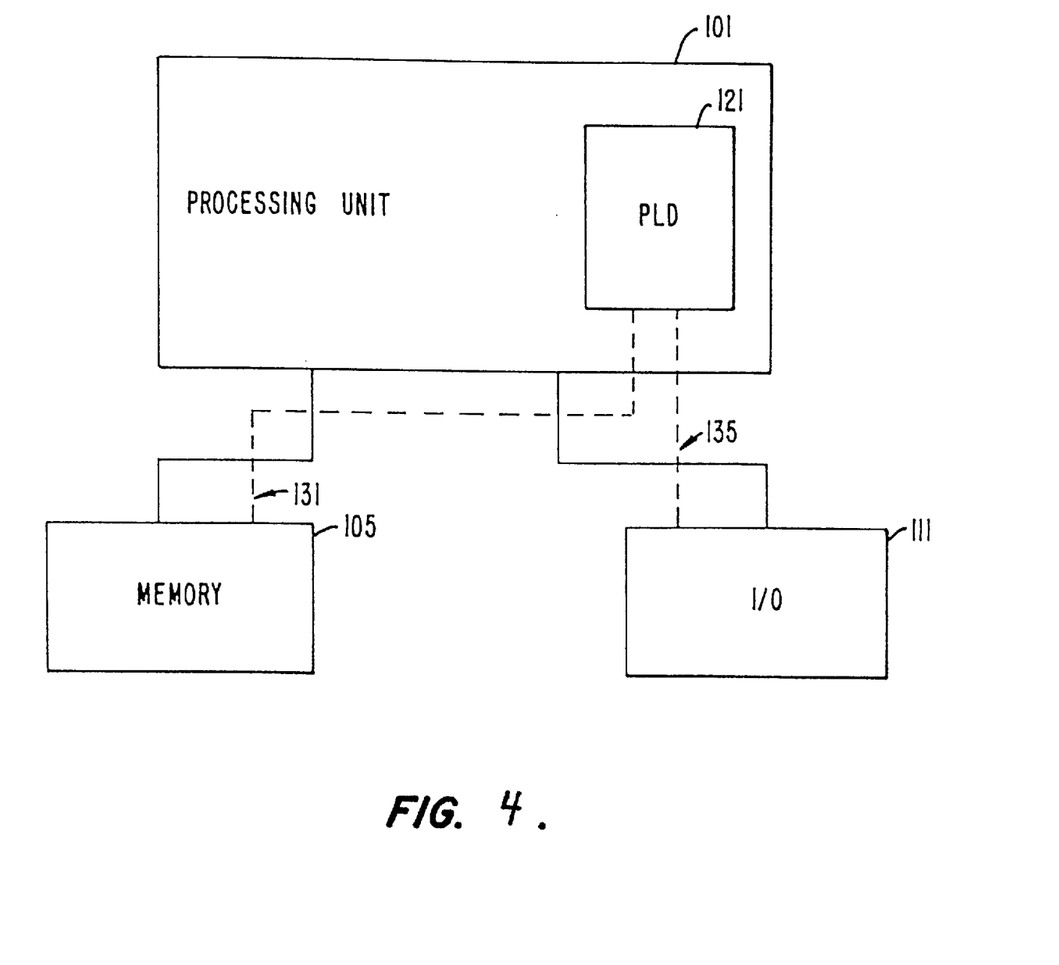
FIG. 4 is a block diagram of a digital processing system including a PLD with enhanced cascade according to the invention.
Figure 5:
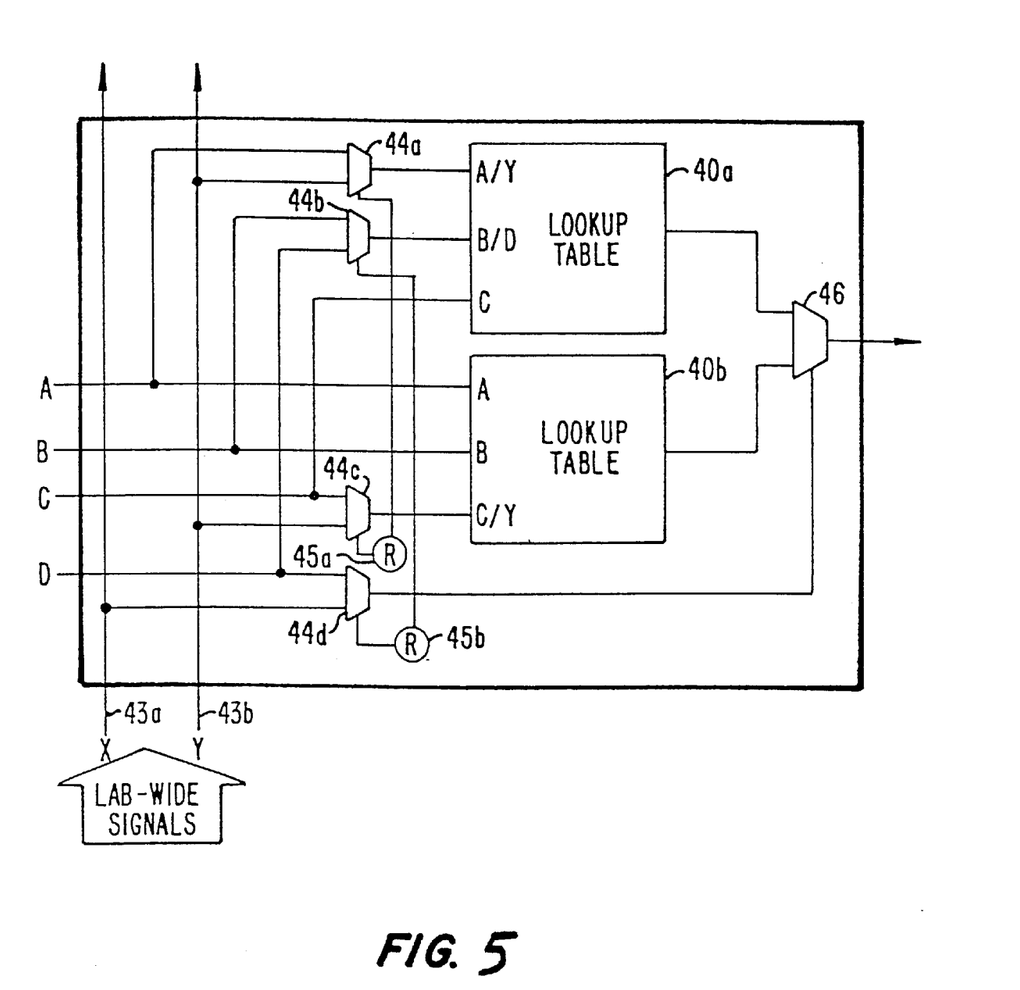
Figure 6:
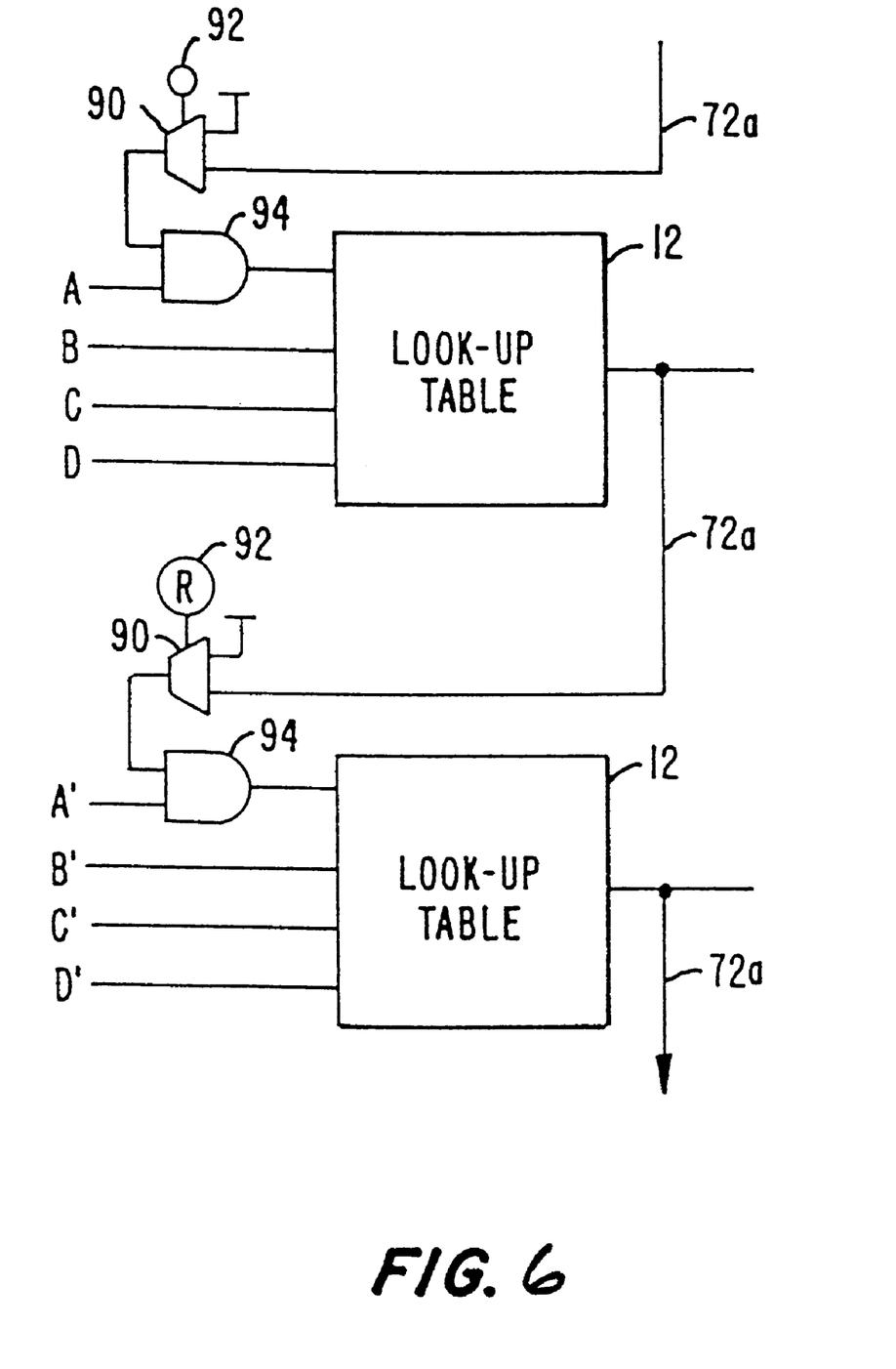

FIG. 4 shows a block diagram of a digital system within which the present invention may be embodied. In the particular embodiment of FIG. 4, a processing unit 101 is coupled to a memory 105 and an I/O 111 and incorporates a programmable logic device (PLD) 121. PLD 121 may be specially coupled to memory 105 through connection 131 and to I/O 111 through connection 135. The system may be a programmed digital computer system, digital signal processing system, specialized digital switching network, or other processing system. Moreover, the system may be a general purpose computer, a special purpose computer (such as telecommunications equipment) optimized for an application-specific task such as programming PLD 121, or a combination of a general purpose computer and auxiliary special purpose hardware.

Processing unit 101 may direct data to an appropriate system component for processing or storage, execute a program stored in memory 105 or input using I/O 111, or other similar function. Processing unit 101 may be a central processing unit (CPU), microprocessor, floating point coprocessor, graphics coprocessor, hardware controller, microcontroller, programmable logic device programmed for use as a controller, or other processing unit. Furthermore, in many embodiments, there is often no need for a CPU. For example, instead of a CPU, one or more PLDs 121 may control the logical operations of the system.

In some embodiments, processing unit 101 may even be a computer system. In one embodiment, source code may be stored in memory 105, compiled into machine language, and executed by processing unit 101. Processing unit 101 need not contain a CPU and in one embodiment, instructions may be executed by one or more PLDs 121. Instead of storing source code in memory 105, only the machine language representation of the source code, without the source code, may be stored in memory 105 for execution by processing unit 101. Memory 105 may be a random access memory (RAM), read only memory (ROM), fixed or flexible disk media, PC Card flash disk memory, tape, or any other storage retrieval means, or any combination of these storage retrieval means.

Processing unit 101 uses I/O 111 to provide an input and output path for user interaction. For example, a user may input logical functions to be programmed into programmable logic device 121. I/O 111 may be a keyboard, mouse, track ball, digitizing tablet, text or graphical display, touch screen, pen tablet, printer, or other input or output means, or any combination of these means. I/O 111 may also be a connection or bus to another processing system that provides input or receives output from 101. In one embodiment, I/O 111 includes a printer used for printing a hard copy of any processing unit 101 output. In particular, using I/O 111, a user may print a copy of a document prepared using a word processing program executed using processing unit 101. In other cases, a user may print out a copy of the source code or a listing of the logical functions contained within PLD 121.

PLD may serve many different purposes within the system in FIG. 4. PLD 121 may be a logical building block of processing unit 101, supporting its internal and external operations. PLD 121 is programmed to implement the logical functions necessary to carry on its particular role in system operation.

As some examples of the multitude of uses for PLD 121, processing unit 101 may use PLD 121, through connection 131, to decode memory or port addresses for accessing memory 105 or I/O 111. PLD 121 may be programmed to store data like a memory or specialized memory, where this comes from processing unit 101 or memory 105 (via connection 131). PLD 121 may be used as a microcontroller for a memory 105 device such as a fixed or flexible disk drive. PLD 121 may also be configured to be a microcontroller for an I/O 111 device such as a keyboard or scanner, passing data through connection 135.

In other embodiments, PLD 121 may be used as a controller or specialized processing unit such as a coprocessor for performing mathematical or graphical calculations. In still other embodiments, PLD 121 may be used for telecommunications applications. For example, processing unit 101 would direct data to PLD 121; PLD 121 processes this data; then PLD 121 returns the results to processing unit 101. Furthermore, processing unit 101 may pass or direct a program stored in memory 105 or input using I/O 111 to PLD 121 for execution. These are some of multitude of uses of PLD 121 within a digital system. Also, a system such as the one shown in FIG. 4 may embody a plurality of PLDs 121, each performing different system functions.

The system shown in FIG. 4 may also be used for programming PLD 121 with a particular logic pattern. A computer program for designing functions into a PLD may be stored in memory 105 and executed using processing unit 101. Then, a design characteristic which is to be programmed into PLD 121 is input via I/O 111 and processed by processing unit 101. In the end, processing unit 101 transfers and programs the design characteristic into PLD 121.

In FIG. 4, processing unit 101 is shown incorporating PLD 121. However, in other embodiments, PLD 121 may be external to processing unit 101, and a PLD interface may be coupled between processing unit 101 and PLD 121. The PLD interface would provide the proper adapters or sockets for interfacing PLD 121 to processing unit 101. Moreover, the PLD interface would provide the proper voltages and electrical characteristics for coupling PLD 121 to processing unit 101.

The invention has now been explained with reference to specific embodiments. However, a number of variations to the invention will be obvious to anyone with skill in the art. For example, the invention need not be limited to circuits that are commonly thought of as PLDs; other types of configurable counter circuits or adder circuits may employ the invention. Also, the particular design of the LABs is not determinative. The invention may be used with SOP-based LABs as well as LUT-based LABs having carry functionality. The invention may also be employed in PLDs having a wide variety of LAB and LE architectures and a number of different interconnect strategies. Finally, the particular configuration of the cascade and the global interconnect are not determinative. Circuits in which the invention may be employed may have a limited or modified global interconnect and may employ either a more limited or more extensive cascade chain that those depicted in the specific embodiments. It is therefore intended that the invention not be limited except as specified in the attached claims.

What is claimed is:

1. A configurable electronic device comprising:
a plurality of configurable logic elements, at least one logic element comprising a plurality of outputs and a plurality of inputs wherein said outputs each represent configurable logical functions of said inputs and wherein at least one logic element has associated with it:
a cascade logic gate for combining an input directed to said configurable logic element with an output of another configurable logic element; and
a cascade connector for conveying a signal from said output of said another configurable logic element to said cascade logic gate.

2. A configurable electronic device comprising:
a plurality of configurable logic elements, at least one logic element comprising a plurality of outputs and a plurality of inputs wherein said outputs each represent logical functions of said inputs and wherein at least one logic element has associated with it:
a cascade logic gate for combining an input directed to said logic element with an output of another logic element; and
a cascade connector for conveying a signal from said output of said another logic element to said cascade logic gate wherein said logic element further has associated with it a cascade selector with its output coupled to an input of said cascade logic gate, one of its selectable inputs coupled to said cascade connector and another of its selectable inputs coupled to a signal providing a constant logic value.

3. A configurable electronic device comprising:
a plurality of configurable logic elements, at least one logic element comprising an output and a plurality of inputs wherein said output represents logical functions of said inputs and wherein at least one logic element has associated with it:
   a cascade logic gate for combining an input directed to said logic element with an output of another logic element; and
   a cascade connector for conveying a signal from said output of said another logic element to said cascade logic gate wherein said at least one logic element is comprised of a plurality of look-up tables.

4. The configurable electronic device according to claim 3 wherein data in said plurality of look-up tables is stored in static random access memory.

5. The configurable electronic device as recited in claim 4 wherein the configurable electronic device is connected to a system via a plurality of input/output connections in said device for connecting signals on said global interconnect to elements of said system, said system comprising:
   a processing unit;
   a memory; and
   an input/output interface.

6. A configurable electronic device comprising:
   a plurality of configurable logic elements, at least one logic element comprising a plurality of outputs and a plurality of inputs wherein said outputs each represent logical functions of said inputs and wherein at least one logic element has associated with it:
   a cascade logic gate for combining an input directed to said logic element with an output of another logic element; and
   a cascade connector for conveying a signal from said output of said another logic element to said cascade logic gate wherein said logic elements are grouped into a plurality of logic blocks, at least one logic block comprising outputs and an array of local interconnection lines within said logic block; and further comprising a general interconnect structure programmably connecting the outputs of one of said logic blocks to said array of local interconnection lines of another of said logic blocks.

7. The configurable electronic device according to claim 6 further comprising a plurality of multiplexers with inputs connected to said general interconnect structure and outputs connected to said array of local interconnection lines.

8. The configurable electronic device as recited in claim 6 wherein said general interconnect structure comprises an array of vertical and horizontal interconnect lines between said logic blocks.

9. The configurable electronic device as recited in claim 6 wherein said at least one logic block further comprises:
   a carry input line; and
   a carry input selector with its output coupled to the carry input line, one of its selectable inputs coupled to a direct carry output of an adjacent logic block and another of its selectable inputs coupled to said array of local interconnection lines.

10. The configurable electronic device as recited in claim 6 further comprising a logic block cascade input line selectably connectable to a logic block cascade output of an adjacent logic block or to said general interconnect structure.

11. The configurable electronic device as recited in claim 6 wherein said array of local interconnection lines is fully populated to inputs of individual logic elements in said logic block.

12. The configurable electronic device as recited in claim 1 wherein the configurable electronic device is connected to a system via a plurality of input/output connections in said device for connecting signals on said global interconnect to elements of said system, said system comprising:
   a processing unit;
   a memory; and
   an input/output interface.

13. A programmable logic device comprising:
   a plurality of logic elements grouped into a plurality of logic array blocks (LABs), at least one LAB comprising a plurality of inputs and outputs and capable of performing a logic function such that said at least one LAB's outputs each represent logical functions of its inputs;
   a general interconnect structure capable of routing the outputs of one of said LABs to the inputs of another of said LABs;
   at least one LAB-based interconnect, each LAB-based interconnect associated with a particular LAB capable of connecting selected lines of said general interconnect to selected input lines of said LAB wherein at least one logic element has associated with it:
   a cascade logic gate for combining an input directed to said logic element with an output of another logic element; and
   a cascade connector for conveying a signal from said output of said another logic element to said cascade logic gate.

14. A programmable logic device as recited in claim 13 wherein said logic elements are comprised of a plurality of look-up tables.

15. A programmable logic device as recited in claim 13 wherein said LAB further comprises a LAB cascade output line selectable connectable to a LAB cascade input of an adjacent or nearby LAB or to said general interconnect structure.

16. A programmable logic device as recited in claim 13 wherein data in said plurality of logic elements is stored in static random access memory.

17. A method in a programmable logic device of logically combining configurable logic element signals comprising the steps of:
   providing at least one configurable logic element with a cascade logic gate;
   routing an output signal from another configurable logic element to an input of said cascade logic gate such that said output signal may be selectably combined with a signal directed to an input of said at least one configurable logic element.

18. A configurable logic device comprising:
   a plurality of logic array blocks (LABs), arranged in a plurality of rows and columns, at least one LAB having a plurality of inputs and outputs and capable of performing a logic function such that said at least one LAB's outputs each represent logical functions of its inputs, said logic function being programmable during chip manufacture or use;
   a general interconnect structure comprising a plurality of rows of conductors and a plurality of columns of conductors, said general interconnect structure capable of routing select signals between said columns of conductors and said rows of conductors;
   LAB output lines for selectively connecting said LAB outputs to said general interconnect structure;
   at least one LAB-based interconnect associated with a particular LAB capable of connecting selected lines of said general interconnect to selected input lines of said LAB; and a plurality of configurable logic elements wherein at least one logic element has associated with it within said LAB:
a cascade logic gate for combining an input directed to said logic element with an output of another logic element with its output connected to an input of said at least one logic element; and
a cascade connector for conveying a signal from said output of said another logic element to said cascade logic gate.

19. The configurable logic device of claim 18 wherein said at least one LAB-based input interconnect is a fully populated interconnection between inputs to logic elements of said LAB and outputs of a plurality of multiplexers, said multiplexers having their inputs connected to conductors in said general interconnect structure.

20. The configurable logic device of claim 19 wherein the outputs of said multiplexers are selected by a programmable store.

21. The configurable logic device of claim 20 wherein the programmable store is an SRAM cell.

22. The configurable logic device of claim 18 wherein the LABs are comprised of a plurality of look-up tables.

23. The configurable logic device of claim 18 wherein each output of a LAB is connectable to a limited number of lines in said general interconnect and to a feedback input back into said LAB-based interconnect.

24. A digital information processing system comprising:
an input device;
an output device;
a main processor;
a memory each operable connected to one another so that data signals may be communicated between said input device, said main processor, said memory, and said output device; and
at least one programmable logic device connected to said main processor via a plurality of input/output connections in said device for connecting signals on said general interconnect to elements of said system, comprising:
a plurality of logic elements grouped into a plurality of logic array blocks (LABs), at least one LAB comprising a plurality of inputs and outputs and capable of performing a logic function such that said at least one LAB's outputs each represent logical functions of its inputs;
a general interconnect structure capable of routing the outputs of one of said LABs to the inputs of another of said LABs;
at least one LAB-based interconnect, each LAB-based interconnect associated with a particular LAB capable of connecting selected lines of said general interconnect to selected input lines of said LAB wherein at least one logic element has associated with it:
a cascade logic gate for combining an input directed to said logic element with an output of another logic element; and
a cascade connector for conveying a signal from said output of said another logic element to said cascade logic gate.

25. The digital information processing system of claim 24 wherein said logic blocks are comprised of a plurality of look-up tables and wherein said general interconnect structure comprises a plurality rows and columns of conductors and wherein data in said look-up tables is stored in static random access memory and further comprising a plurality of multiplexers with inputs connected to said general interconnect structure and outputs connected to said each LAB-based interconnect.

26. The digital information processing system of claim 25 further comprising a LAB cascade-out line connectable to said general interconnect structure and a LAB cascade-in connector connectable to said local interconnect structure.

* * * * *